(12) United States Patent
Prisco et al.

(10) Patent No.: US 12,660,141 B2
(45) Date of Patent: Jun. 16, 2026

(54) FLEXIBLE CONDUCTIVE ELECTROMAGNETIC COMPATIBILITY SHIELD

(71) Applicant: International Business Machines Corporation, Armonk, NY (US)

(72) Inventors: Joseph Prisco, Rochester, MN (US); Jacob Dixon, Rochester, MN (US); Marvin M. Misgen, Rochester, MN (US); Michael Paul Petrich, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 17/934,296

(22) Filed: Sep. 22, 2022

(65) Prior Publication Data

US 2024/0107730 A1 Mar. 28, 2024

(51) Int. Cl.
*H05K 9/00* (2006.01)
(52) U.S. Cl.
CPC .................................. *H05K 9/0088* (2013.01)
(58) Field of Classification Search
CPC .................................................... H05K 9/0088
USPC ........................................ 361/816, 818, 799
See application file for complete search history.

(56) References Cited

U.S. PATENT DOCUMENTS

| | | | |
|---|---|---|---|
| 3,531,613 A | 9/1970 | Domenichini et al. | |
| 8,693,158 B2 | 4/2014 | Chew et al. | |

| | | | | |
|---|---|---|---|---|
| 2002/0114138 A1* | 8/2002 | Laufer | ................. | H05K 9/0037 |
| | | | | 361/695 |
| 2004/0240191 A1* | 12/2004 | Arnold | ................. | H05K 9/0035 |
| | | | | 257/E23.079 |
| 2006/0127653 A1 | 6/2006 | Mao et al. | | |
| 2009/0108985 A1* | 4/2009 | Haag | ................. | H03K 17/9622 |
| | | | | 29/610.1 |
| 2010/0233969 A1 | 9/2010 | Frolik et al. | | |
| 2016/0309628 A1* | 10/2016 | Ghosh | ....................... | C08K 3/22 |
| 2021/0346113 A1* | 11/2021 | Nuzum | ................. | A61B 90/05 |

FOREIGN PATENT DOCUMENTS

| | | |
|---|---|---|
| CN | 106584623 B | 12/2017 |
| CN | 107889439 B | 11/2019 |

OTHER PUBLICATIONS

Bunting, C.F., "Shielding Effectiveness in a Two-Dimensional Reverberation Chamber Using Finite-Element Techniques," IEEE Transactions on Electromagnetics Compatibility, vol. 45, No. 3, Aug. 2003, 5 pgs.

(Continued)

*Primary Examiner* — Hung S. Bui
(74) *Attorney, Agent, or Firm* — Scott Dobson

(57) ABSTRACT

An information technology system includes a housing, electronics arranged within the housing, and a flexible shield arranged within the housing. The electronics emit electromagnetic interference. The flexible shield is arranged such that at least some of the electromagnetic interference is incident upon a surface of the flexible shield. The flexible shield is configured to be alternately at rest and active. The surface of the flexible shield is substantially planar when the flexible shield is at rest and the surface of the flexible shield is undulating when the flexible shield is active.

20 Claims, 6 Drawing Sheets

(56) References Cited

OTHER PUBLICATIONS

Digi-Key Electronics, "EMI/RFI Absorbers," https://www.digikey.com/en/product-highlight/3/3m/emirfi-absorbers, printed May 31, 2022, 4 pgs.

Duratech Industries, "Membrane Switches," https://www.duratech.com/capabilities/membrane-switches/, printed May 31, 2022, 4 pgs.

Gros et al., "Universal behaviour of a wave chaos based electromagnetic reverberation chamber," https://arxiv.org/pdf/1308.2039.pdf, Aug. 9, 2013, 12 pgs.

Harima et al., "Evaluation of E-field Uniformity for Radiated Immunity Testing in a Reverberation Chamber," 2001 IEEE EMC International Symposium. Symposium Record. International Symposium on Electromagnetic Compatibility (Cat. No. 01CH37161), 2001, pp. 768-770 vol.2, doi: 10.1109/ISEMC.2001.950471.

IEEE, "C63.4-2014—Amencan National Standard for Methods of Measurement of Radio-Noise Emissions from Low-Voltage Electrical and Electronic Equipment in the Range of 9 kHz to 40 GHzm," https://ieeexplore.ieee.org/document/6840852, in ANSI C63.4-2014 (Revision of ANSI C63.4-2009), vol. No., pp. 1-170, Jun. 20, 2014, doi: 10.1109/IEEESTD.2014.6840852.

Koo et al., "Frequency-Domain Measurement Method for the Analysis of ESD Generators and Coupling," https://ieeexplore.ieee.org/document/4294127, IEEE Transactions on Electromagnetic Compatibility, vol. 49, No. 3, Aug. 2007, pp. 504-511.

Onsemi, "Human Body Model (HBM) vs. IEC 6100-4-2," ON Semiconductor is Now,, TND410/D, Rev. 0, Sep. 2010, https://www.onsemi.com/pub/Collateral/TND410-D.PDF, © Semiconductor Components Industries, LLC, 2010, 8 pgs.

Tokin, Electronic Components, a KEMET Company, "Flex suppressor," Noise suppression sheet, https://www.tokin.com/english/product/pdf_dl/flex.pdf, printed May 31, 2022, 15 pgs.

Unknown, "Beamwidths and Sidelobe Levels," https://www.antenna-theory.com/basics/radPatDefs.php, printed May 31, 2022, 2 pgs.

Unknown, "Slot Antennas," https://www.antenna-theory.com/antennas/aperture/slot.php, printed May 31, 2022, 5 pgs.

Wikipedia, "Spark-gap transmitter," https://en.wikipedia.org/wiki/Spark-gap_transmitter, printed May 31, 2022, 17 pgs.

* cited by examiner

FLEXIBLE CONDUCTIVE ELECTROMAGNETIC COMPATIBILITY SHIELD

BACKGROUND

The present disclosure relates generally to the field of electrical equipment and systems, and more particularly to the ability of electrical equipment and systems to function acceptably in their electromagnetic environments.

Electromagnetic compatibility (EMC) is the ability of electrical equipment and systems to function acceptably in their electromagnetic environments, by limiting unintentional generation, propagation and reception of electromagnetic energy which may cause unwanted effects such as electromagnetic interference (EMI) or even physical damage in operational equipment. The goal of EMC is the correct operation of different equipment in a common electromagnetic environment.

SUMMARY

Embodiments of the present disclosure include an information technology system. The information technology system includes a housing. The information technology system further includes electronics arranged within the housing. The electronics emit electromagnetic interference. The information technology system further includes a flexible shield arranged within the housing such that at least some of the electromagnetic interference is incident upon a surface of the flexible shield. The flexible shield is configured to be alternately at rest and active. The surface of the flexible shield is substantially planar when the flexible shield is at rest and the surface of the flexible shield is undulating when the flexible shield is active.

Embodiments of the present disclosure further include an electromagnetic compatibility device configured for use with an information technology system. The information technology system includes a housing and electronics arranged in the housing that emit electromagnetic interference. The electromagnetic compatibility device includes a flexible shield configured to be arranged within the housing such that at least some of the electromagnetic interference is reflected by a surface of the flexible shield. The flexible shield is configured to be alternately at rest and active. The surface of the flexible shield is substantially planar when the flexible shield is at rest and the surface of the flexible shield is undulating when the flexible shield is active.

Embodiments of the present disclosure further include a method of operating an information technology system. The method includes causing a surface of a flexible shield to exhibit a waveform including a plurality of angled surface portions such that electromagnetic interference emitted by electronics of the information technology system is reflected off of the plurality of angled surface portions. An angle of each of the plurality of angled surface portions varies over time.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
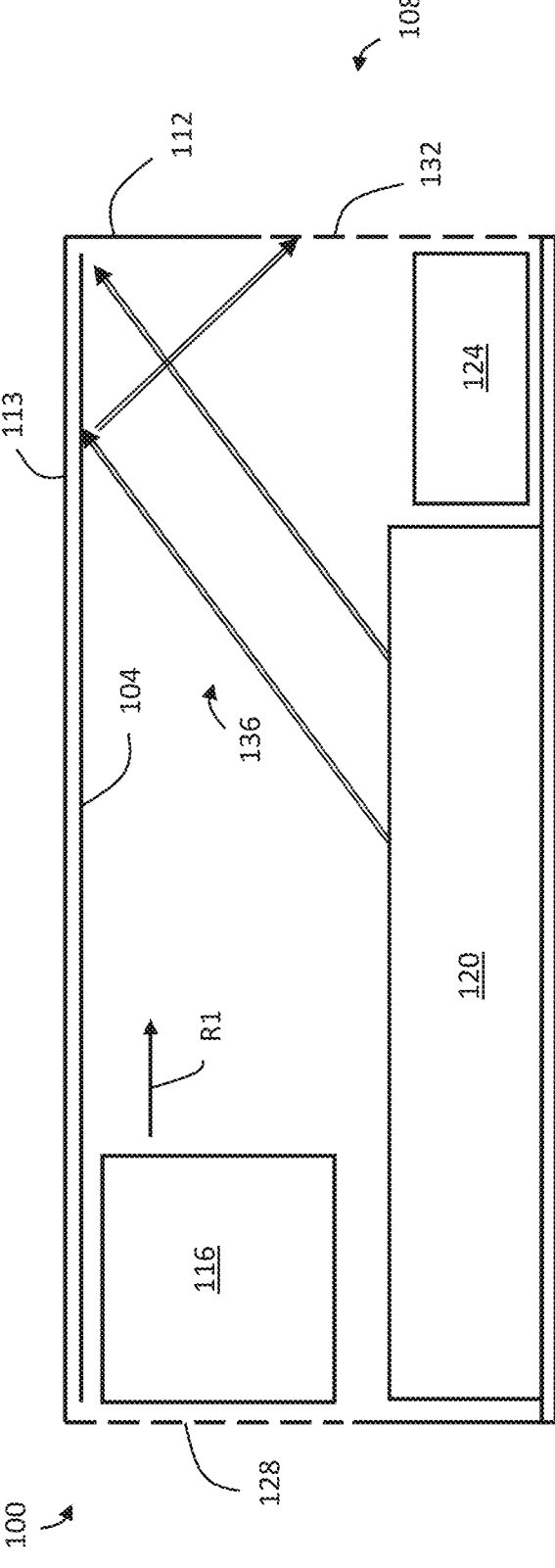
FIG. 1 illustrates a schematic diagram of an example information technology system including an electromagnetic compatibility device that is at rest, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electromagnetic compatibility (EMC), which refers to the ability of electrical equipment and systems to function acceptably in their electromagnetic environments that is achieved by limiting unintentional generation, propagation, and reception of electromagnetic energy which may cause unwanted effects. While the present disclosure is not necessarily limited to such applications, various aspects of the disclosure may be appreciated through a discussion of various examples using this context.

Electromagnetic interference (EMI) refers to the degradation in the performance of equipment or transmission channel or a system caused by an electromagnetic disturbance. EMC is an equipment characteristic or property that refers to the ability of equipment or a system to function satisfactorily in its electromagnetic environment without introducing intolerable electromagnetic disturbances to anything in that environment. Accordingly, EMC ensures the correct operation, in the same electromagnetic environment, of different equipment items which use or respond to electromagnetic phenomena, and the avoidance of interference. In other words, EMC is the control of EMI so as to reduce or minimize unwanted effects.

As a basic illustrative example of EMI in an electromagnetic environment, a device which is producing EMI is referred to as the source (or the emitter) and a device which is being affected by the EMI is referred to as the receptor (or the sink). EMI is produced in the source, for example, due to rapid current and voltage changes, and travels along a path from the source to the receptor. Such a path may be referred to as the coupling path and conducts the EMI via a coupling mechanism, such as conductive coupling, capacitive coupling, magnetic or inductive coupling, or radiative coupling.

The damaging effects of EMI pose unacceptable risks in many areas of technology, and it is necessary to control such interference and reduce the risks to acceptable levels. The risk posed is usually statistical in nature, so much of the work in threat-characterization and standards-setting is based on reducing the probability of disruptive EMI to an acceptable level, rather than assuring its elimination.

Traditional EMC design is governed by international standards for most worldwide geographies. International standards are based on product type, such as for example, medical devices, consumer electronics, and IT equipment. The goal of EMC design is to minimize the amount of unwanted radiated emissions, for example, electromagnetic interference (EMI), while providing reliable protection from external electromagnetic energy, such as electrostatic discharge (ESD) and Electrically Fast Transients (EFT).

Some existing EMC approaches utilize techniques such as circuit design, EMC filters, circuit partitioning, grounding, screened enclosures, and screened lines and cables. However, such EMC approaches do not enable certain products to be shielded from ESD while a user or service provider performs maintenance on internal circuitry of the products. It is advantageous to develop an EMC device which enables shielding from ESD during maintenance on internal circuitry of the products and which is able to be implemented within the housing of an existing product.

It is to be understood that the aforementioned advantages are example advantages and should not be construed as limiting. Embodiments of the present disclosure can contain all, some, or none of the aforementioned advantages while remaining within the spirit and scope of the present disclosure.

Turning now to the figures, FIG. 1 depicts an EMC device 100 according to at least some illustrative embodiments of the present disclosure. As described in further detail below, the EMC device 100 utilizes electro-mechanical properties of a flexible shield 104 to increase the uniformity of the distribution of EMI that is emitted by an information technology (ITE) system 108. More specifically, in accordance with at least one embodiment of the present disclosure, the shield 104 is a flexible, transparent sheet of polycarbonate including a pattern of conductive ink formed thereon.

In accordance with at least one embodiment of the present disclosure, the EMC device 100 includes only the shield 104. Alternatively, the EMC device 100 can include the shield 104 as well as one or more additional features or components. In accordance with at least one embodiment of the present disclosure, the one or more additional features or components are part of the ITE system 108. Alternatively, the one or more additional features or components are independent of the ITE system 108.

As shown in FIG. 1, the ITE system 108 includes a housing 112 which encloses a fan and/or blower 116, electronics 120, and a power supply 124. In accordance with at least one embodiment of the present disclosure, the housing 112 is made of metal. The shield 104 is also enclosed within the housing 112. In accordance with at least one embodiment of the present disclosure, the shield 104 is fixed in position within the housing 112 by, for example, bonding or otherwise affixing at least some of the edges of the polycarbonate sheet to walls or other positionally fixed elements of the housing 112. In accordance with at least one such embodiment of the present disclosure, edges of the polycarbonate sheet that are not visible in FIG. 1 are affixed to walls of the housing 112 that are not visible in FIG. 1. Notably, while the position of the shield 104 within the housing 112 is fixed, the shield 104 is movable within that fixed position. For example, a surface of the shield 104 may be caused to undulate without moving the shield 104 from its fixed position within the housing 112.

As described in further detail below, due to its flexibility, a surface of the shield 104 is able to be configured as a flat, substantially planar surface or, alternatively, as an undulating surface. When the surface is configured as an undulating surface, the shield 104 may be described as being "active." When the shield 104 is active, the surface of the shield 104 may be described as exhibiting a waveform or an oscillating movement. When the surface is configured as a flat, substantially planar surface, the shield 104 may be described as being "at rest." As used herein, the term "substantially planar" refers to a surface which is planar to the extent that is necessary to achieve the functionality of its planarity. In other words, the extent to which the surface may be non-planar and still be considered "substantially planar" is that which does not affect the functionality achieved by the planarity of the surface. When the shield 104 is at rest, the surface of the shield 104 acts in substantially the same manner as a wall of the housing 112. In other words, when the shield 104 is at rest, the surface of the shield 104 produces the substantially the same effect as a wall of the housing 112. Accordingly, the shield 104 essentially produces no effect on the ITE system 108 when it is at rest.

The shield 104 is configured such that it is either at rest or it is active. Accordingly, when the shield 104 is not at rest, it is active, and when the shield 104 is not active, it is at rest. In other words, the shield 104 is configured to be alternately at rest and active. As used herein, the term "alternately" refers to two possibilities continually following and succeeded by one another.

The fan and/or blower 116 is configured to cool the electronics 120 and/or power supply 124 by moving air over the surfaces thereof. In accordance with at least one embodiment, the housing 112 includes at least one opening which acts as an inlet 128 for the admittance of air into the housing 112 and at least one opening which acts as an outlet 132 for the expulsion of air out of the housing 112. Such air can be moved through and within the housing 112 by the fan and/or blower 116. In accordance with at least one embodiment of the present disclosure, the rate at which the fan and/or blower 116 moves air can be adjusted. For example, the fan and/or blower 116 can be adjusted to move more or less air through the housing 112. In other words, the speed of the fan and/or blower 116 can be adjusted.

As described in further detail below, in accordance with some embodiments of the present disclosure, movement of air within the housing 112, caused by operation of the fan and/or blower 116, causes the shield 104 to be active. Accordingly, in such embodiments, altering the speed of the fan and/or blower 116 can alter the rate R1 at which air is expelled by the fan and/or blower 116, thereby altering the waveform exhibited by the surface of the active shield 104. More specifically, a rate of undulation of a surface of the active shield 104 can be affected by altering the rate R1 at which the fan and/or blower 116 expels air. Additionally, a lack of operation of the fan and/or blower 116 causes the shield 104 to be at rest, and therefore configured as a flat, substantially planar surface.

In the embodiment shown in FIG. 1, the shield 104 is arranged within the housing 112 such that, when it is at rest, the shield 104 is substantially parallel with a top wall 113 of the housing 112. As used herein, the term "substantially parallel" refers to a surface which is parallel to the extent that is necessary to achieve the functionality of its parallel-ness. In other words, the extent to which the surface may be non-parallel and still be considered "substantially parallel" is that which does not affect the functionality achieved by the parallel-ness of the surface. Additionally, the shield 104 is arranged between the top wall 113 and the fan and/or blower 116, the electronics 120, and the power supply 124. In other embodiments, it is possible for these elements to be arranged differently within the housing 112.

In accordance with the illustrative embodiments of the present disclosure, the electronics 120 of the ITE system 108 are a source of EMI 136. In FIG. 1, the EMI 136 is depicted as a plurality of rays being generated by the electronics 120 to illustrate example paths and reflection paths of the EMI 136 within the housing 112. The metal material of the housing 112 reflects the EMI 136 that is incident thereupon. Similarly, when the shield 104 is at rest, as it is depicted in FIG. 1, it reflects the EMI 136 in substantially the same manner as the housing 112.

As a result of the particular geometry of the ITE system 108, including the relative arrangement of the elements of the ITE system 108 within the housing 112 and the dimensions of the housing 112, the paths and reflection paths of the EMI 136 within the housing 112 generate areas of greater and lesser EMI concentration within the housing 112. The particular distribution of such areas represents the modal distribution of the electric field and can be referred to as an "EMI signature."

Figure 2:
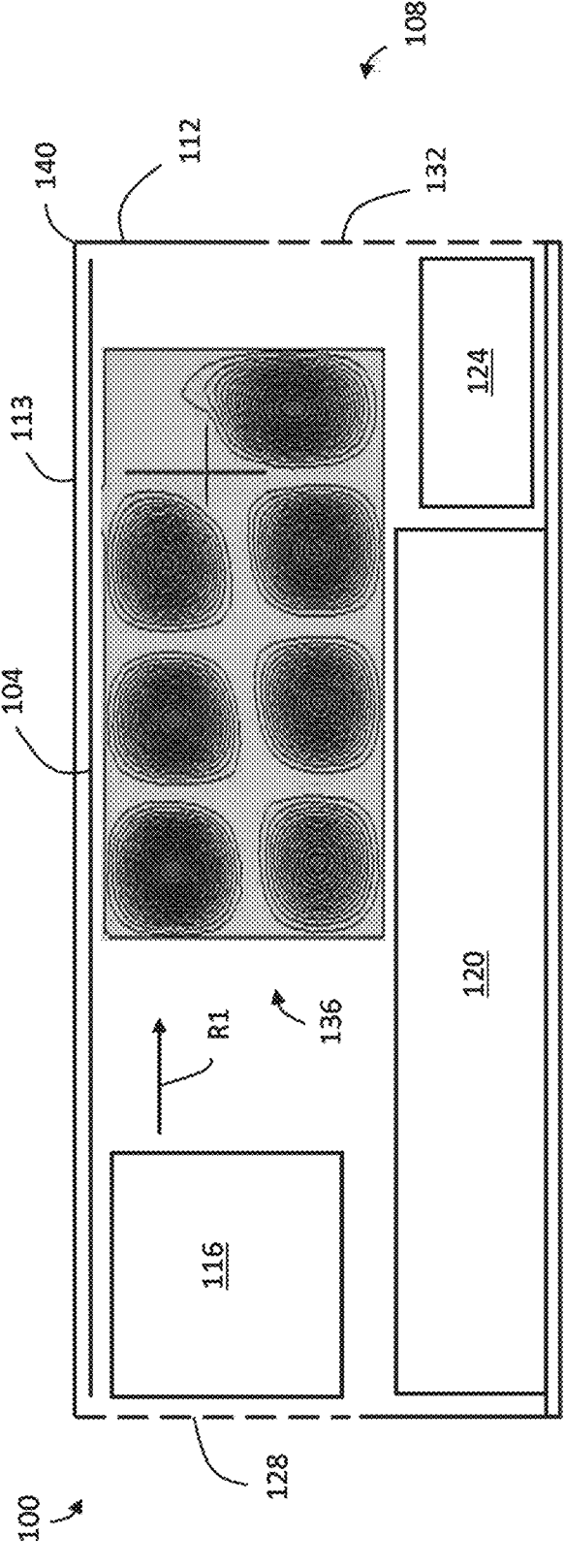
FIG. 2 illustrates a schematic diagram of an electromagnetic interference signature generated by the example information technology system of FIG. 1, in accordance with embodiments of the present disclosure.

In FIG. 2, the EMI 136 is depicted as a plurality of fields to illustrate example areas of greater and lesser concentration within the housing 112. The EMI 136 depicted in FIG. 2 is provided as an example illustration and is only intended to be used as a visual aid to facilitate conceptual understanding of the phenomenon of modal distribution of the electric field. To this end, areas illustrated with a darker color represent areas having a greater concentration, and therefore a higher intensity, of EMI, and areas illustrated with a lighter color represent areas having a lesser concentration, and therefore a lower intensity, of EMI. The fields of EMI 136 depicted in FIG. 2 illustrate the example EMI signature. Notably, the EMI signature depicted in FIG. 2 is illustrative of when the shield 104 is at rest.

Due at least in part to the reflective nature of the metal walls of the housing 112, the EMI 136 is more readily able to escape the housing 112 at gaps formed at seams 140 of the housing 112 and at the openings that act as the inlet 128 and outlet 132 for the housing 112. In other words, the emission of EMI 136 is concentrated at the seams 140, inlet 128, and outlet 132. In accordance with some embodiments of the present disclosure, some amounts of EMI 136 may be emitted from other areas of the ITE system 108. However, as illustrated by the present embodiment, the seams 140, inlet 128, and outlet 132 of the ITE system 108 provide areas from which EMI 136 can more easily escape the ITE system 108.

The particular pattern of EMI emissions from the ITE system 108 can be referred to as an "emissions profile." The emissions profile is determined, in part, by the particular geometry of the ITE system 108 as well as by the EMI signature within the housing 112. In other words, the EMI signature within the housing 112 contributes to, and therefore correlates with, the emissions profile.

Figure 3:
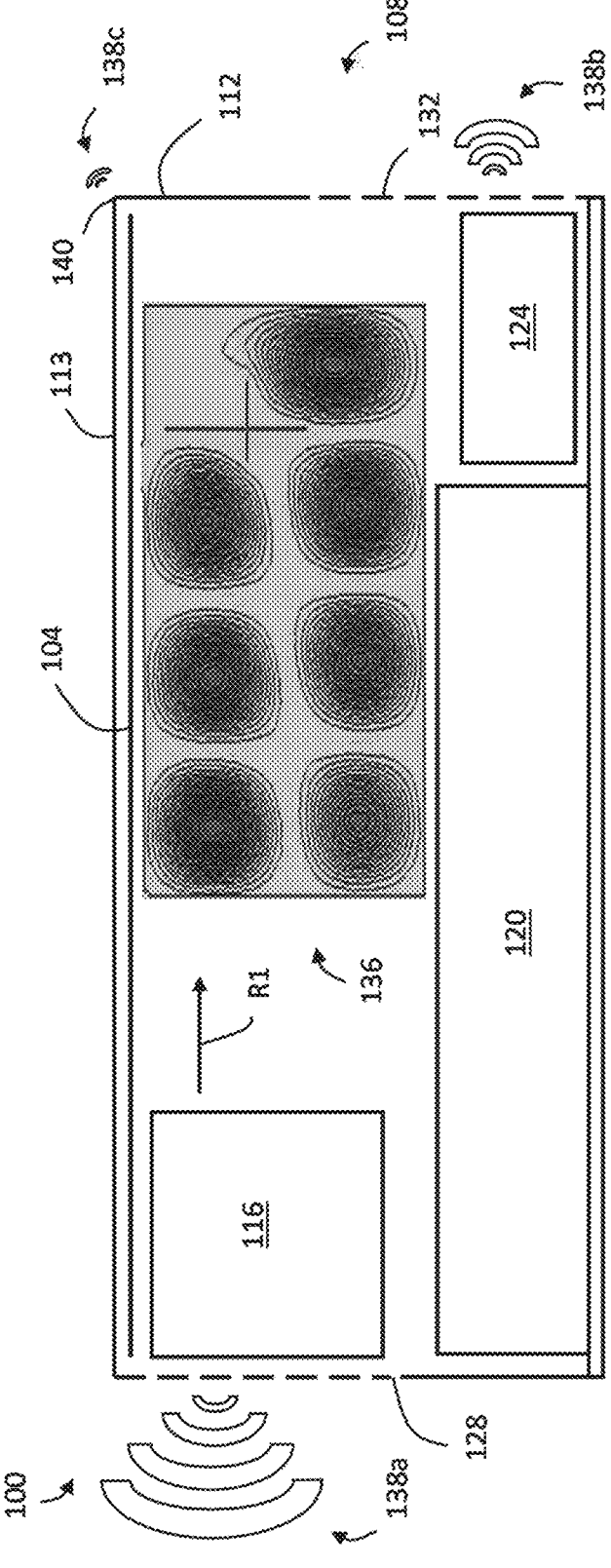
FIG. 3 illustrates a schematic diagram of an electromagnetic interference emissions profile generated by the example information technology system of FIG. 1, in accordance with embodiments of the present disclosure.

FIG. 3 illustrates the emissions profile for the illustrative embodiment described herein. As shown, the illustrative emissions profile includes a first EMI emission 138a, which is concentrated at the inlet 128, a second EMI emission 138b, which is concentrated at the outlet 132, and a third EMI emission 138c, which is concentrated at a seam 140. The emissions profile shown in FIG. 1 is for illustrative purposes only. Accordingly, a real-world emissions profile may be different than that shown in FIG. 1 for this or other embodiments.

As shown in FIG. 3, the first EMI emission 138a of the emissions profile for the ITE system 108 has a larger magnitude than the second EMI emission 138b, and the second EMI emission 138b has a larger magnitude than the third EMI emission 138c. In other words, the ITE system 108 generates an uneven spatial distribution of EMI emissions. Notably, the emissions profile depicted in FIG. 3 is illustrative of when the shield 104 is at rest. Such an emissions profile can be undesirable because the magnitude of the first EMI emission 138a may be large enough to initiate an unwanted effect on another object. It is desirable to be able to alter the emissions profile to reduce the likelihood of such unwanted effects. As described in further detail below, embodiments of the present disclosure enable alteration of the emissions profile. More specifically, the undulation of the shield 104, when active, alters the emissions profile of the ITE system 108.

Figure 4A:
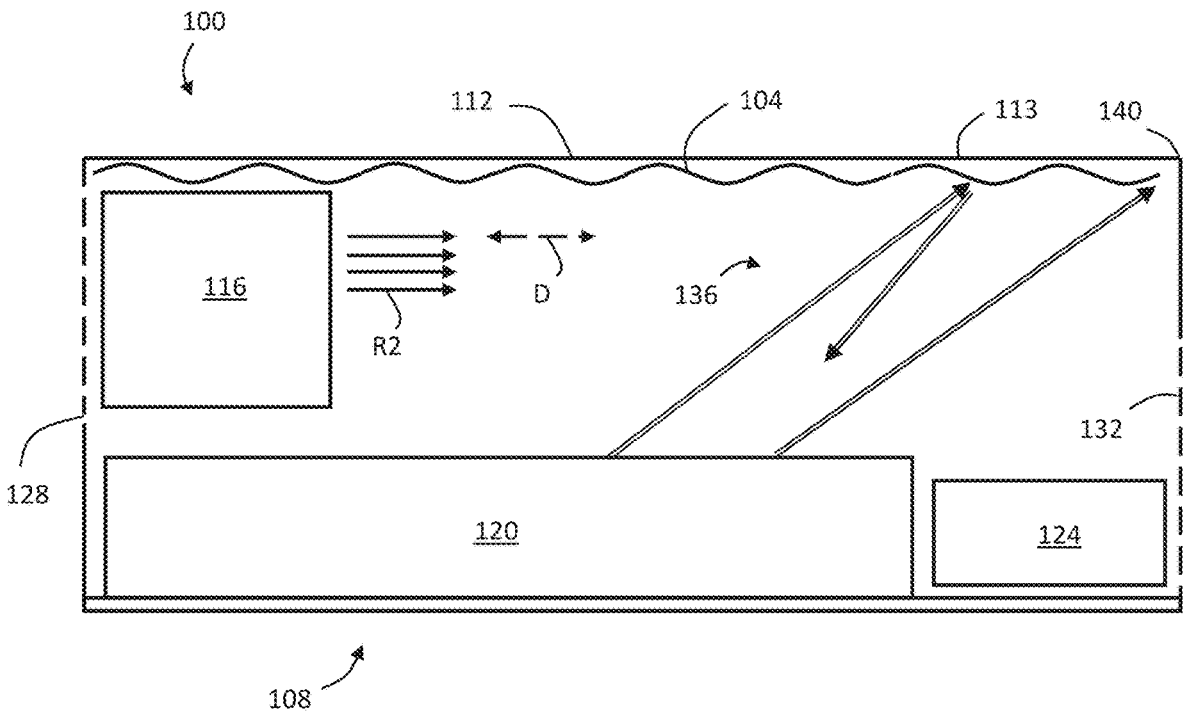
FIG. 4A illustrates a schematic diagram of the example information technology system of FIG. 1 including an electromagnetic compatibility device that is active at a first point in time, in accordance with embodiments of the present disclosure.
Figure 4B:
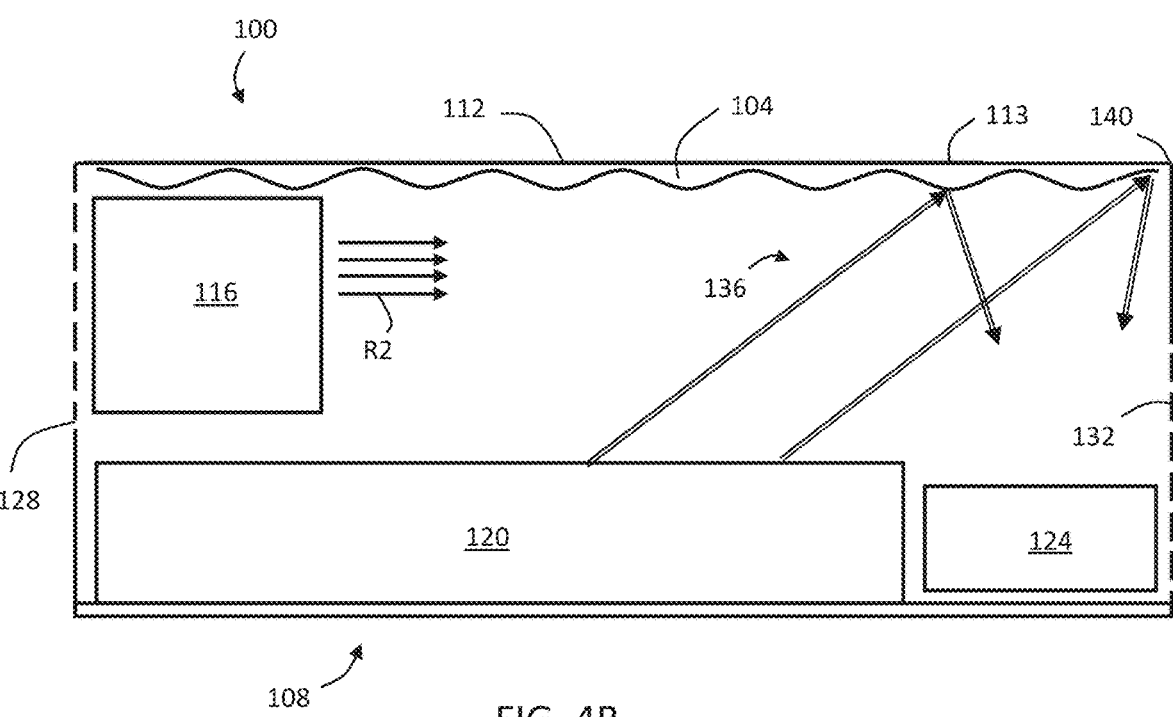
FIG. 4B illustrates a schematic diagram of the example information technology system of FIG. 4A at a second point in time, in accordance with embodiments of the present disclosure.

FIGS. 4A and 4B depict the ITE system 108 when the fan and/or blower 116 is expelling air at a rate R2 that is sufficient to cause the shield 104 to be active. In at least one embodiment of the present disclosure, the fan and/or blower 116 is also moving air in the housing 112 of the ITE system 108 depicted in FIGS. 1-3. However, in the depictions illustrated by FIGS. 1-3 and described above, the rate R1 of airflow is not sufficient to cause the shield 104 to be active. Accordingly, in the depictions illustrated by FIGS. 1-3 and described above, the shield 104 is at rest. In other words, the fan and/or blower 116 may be configured to move air through the housing 112 at all times but may not always move air through the housing 112 at a rate that is sufficient to cause the shield 104 to be active. The rate R2 of airflow is greater than the rate of airflow R1, but the precise rates can be selected based on the needs of the system for a particular application.

Notably, in the illustrative embodiment described herein, the shield 104 is arranged within the housing 112 such that, when the shield 104 is at rest, the shield 104 is substantially parallel with the direction D (shown in FIG. 4A) at which air is expelled by the fan and/or blower 116. Geometrically, the direction D extends along a line that exists in a plane. The shield 104 is arranged in a plane that is substantially parallel to the plane in which the line along which the direction D extends is included. In accordance with at least one embodiment of the present disclosure, the plane in which the shield 104 is arranged can be the same as the plane in which the line of the direction D is included. More specifically, the shield 104 can be arranged such that the plane defined by the surface of the shield 104 when the shield 104 is at rest is the same as the plane in which the line of the direction D is included. Two planes that are the same as one another may be referred to as being coincident.

The arrangement of the shield 104 relative to the airflow generated by the fan and/or blower 116 facilitates movement of the shield 104 by the airflow generated by the fan and/or blower 116, thereby causing the shield 104 to be active. Accordingly, FIGS. 4A and 4B depict the shield 104 exhibiting a waveform. In particular, FIG. 4A depicts the active shield 104 at a first point in time, and FIG. 4B depicts the active shield 104 at a second point in time. The distribution of waves of the waveform exhibited by the active shield 104 is different within the housing 112 at the first point in time than at the second point in time. In other words, the shield 104 is actively moving such that the surface varies over time.

When the shield 104 is active, is undulating, and is exhibiting a waveform, the surface is made up of a plurality of angled surface portions that are adjacent to one another so as to form a continuous undulating surface. The angle of each of the plurality of angled surface portions varies over time as the shield 104 undulates. Accordingly, the distribution of waves in the waveform varies over time.

FIGS. 4A and 4B depict the EMI 136 generated by the electronics 120 of the ITE system 108 as a plurality of rays, similar to the rays depicted in FIG. 1. Because the distribution of waves in the waveform is different in FIG. 4A than FIG. 4B, the angles of the angled surface portions at which the emitted rays of EMI 136 are incident upon the shield 104 in FIG. 4A are different than the angles of the angled surface portions at which the emitted rays of EMI 136 are incident upon the shield 104 in FIG. 4B. Accordingly, the rays of EMI 136 are reflected in different directions in FIG. 4A than in FIG. 4B. In other words, the angles of the reflected rays are different in FIG. 4A than in FIG. 4B.

Figure 5A:
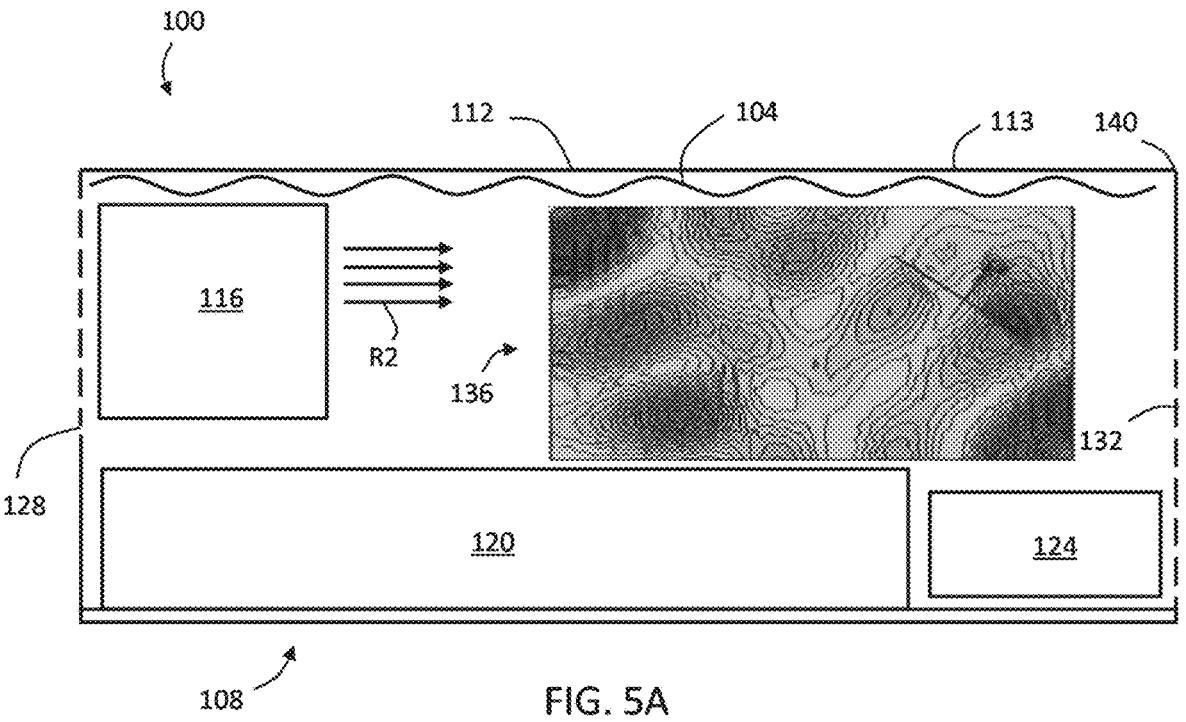
FIG. 5A illustrates a schematic diagram of an electromagnetic interference signature generated by the example information technology system of FIG. 4A, in accordance with embodiments of the present disclosure.
Figure 5B:
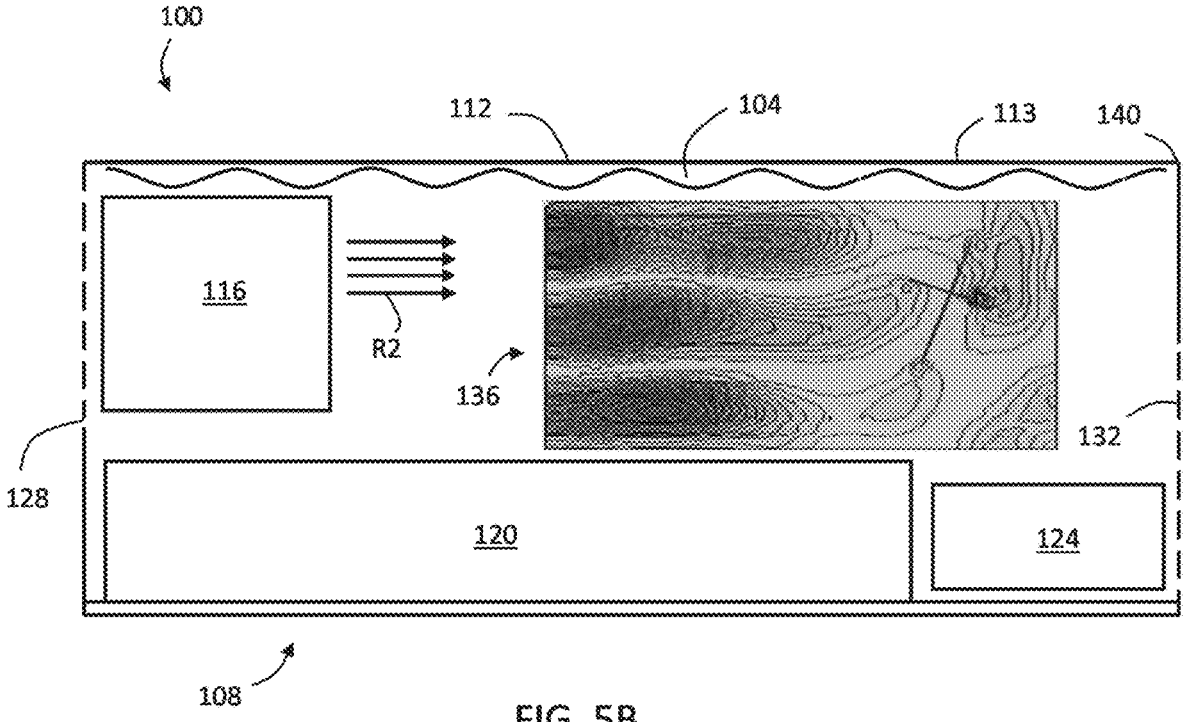
FIG. 5B illustrates a schematic diagram of an electromagnetic interference signature generated by the example information technology system of FIG. 4B, in accordance with embodiments of the present disclosure.

In FIGS. 5A and 5B, the EMI 136 is depicted as a plurality of fields, similar to the fields depicted in FIG. 2, to illustrate the EMI signature of the ITE system 108 when the shield 104 is active. Like FIGS. 4A and 4B, FIGS. 5A and 5B depict fields of EMI 136 at a first point in time and a second point in time. However, the first point in time illustrated in FIG. 5A does not necessarily correlate with the point in time illustrated in FIG. 4A, and the second point in time illustrated in FIG. 5B does not necessarily correlate with the point in time illustrated in FIG. 4B. Instead, like FIGS. 4A and 4B, FIGS. 5A and 5B simply show examples of the EMI signature at two distinct points in time to illustrate that they are different.

In other words, when the shield 104 is active, the EMI signature of the ITE system 108 fluctuates over time. In contrast, when the shield 104 is at rest, the EMI signature of the ITE system 108 is constant over time. Accordingly, because the angles of the reflected rays change as the distribution of the waves of the waveform exhibited by the shield 104 change when the shield 104 is active, the fields of EMI 136 are distributed over time, resulting in a much more dispersed manner, relative to when the shield 104 is at rest. This effect is made apparent by a comparison of fields of EMI 136 shown in FIG. 2 compared to the fields of EMI 136 shown in FIGS. 5A and 5B.

Figure 6:
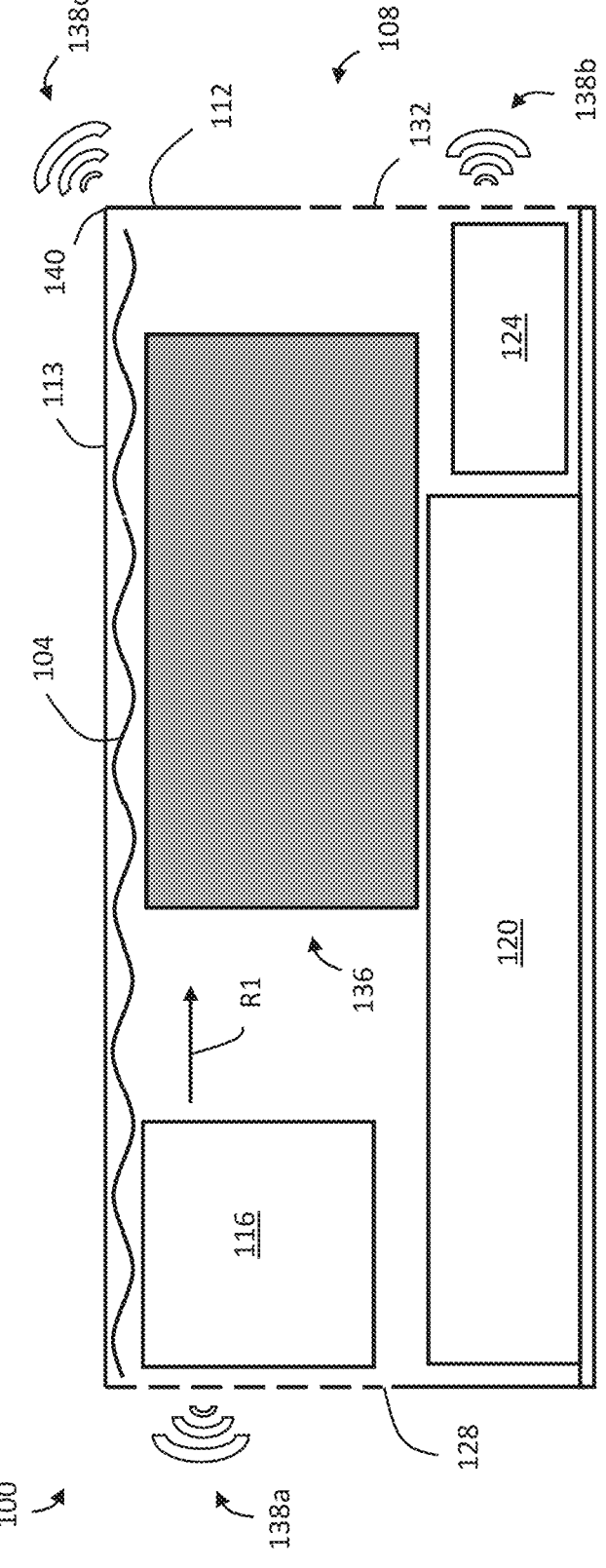
FIG. 6 illustrates a schematic diagram of an electromagnetic interference emissions profile generated by the example information technology system of FIGS. 4A and 4B, in accordance with embodiments of the present disclosure.

FIG. 6 illustrates the emissions profile for the ITE system 108, similar to that shown in FIG. 3, when the shield 104 is active. Notably, the emissions profile shown in FIG. 6 represents an average emissions profile generated over a period of time that includes both the first point in time illustrated in FIG. 5A and the second point in time illustrated in FIG. 5B. Accordingly, the emissions profile shown in FIG. 6 is depicted as a solid color to illustrate the average concentration or intensity of EMI generated over time. Because the EMI signature of the ITE system 108 is more uniformly distributed when the shield 104 is active, the resulting emissions profile for the ITE system 108 is also more uniformly distributed when the shield 104 is active than when it is at rest. Notably, the total amount of emissions is not changed whether the shield 104 is active or at rest, but the distribution of the emissions is made more uniform when the shield 104 is active than when it is at rest.

More specifically, FIG. 6 illustrates that the magnitude of the first EMI emission 138a, which is concentrated at the inlet 128, is substantially the same as the magnitude of the second EMI emission 138b, which is concentrated at the outlet 132, and is substantially the same as the magnitude of the third EMI emission 183c, which is concentrated at the seam 140. As such, when the shield 104 is active (as illustrated by FIG. 6), the magnitude of the first EMI emission 138a has been reduced relative to when the shield 104 is at rest (as illustrated by FIG. 3). In contrast, when the shield 104 is active, the magnitude of the third EMI emission 138c has been increased relative to when the shield 104 is at rest. Accordingly, a comparison of FIGS. 3 and 6 illustrates how the shield 104 enables alterations of the emissions profile of the ITE system 108. In particular, activating shield 104 causes the distribution of EMI emissions by the ITE system 108 to be more isotropic.

By improving the uniformity of the distribution of EMI emissions in an emissions profile, the EMC of the ITE system 108 is improved. As a result, the ability of the ITE system 108 to be able to be used in a greater number of applications is increased by improving the uniformity of the emissions profile. By way of example, the EMC device 100 can be utilized with ITE systems in electronic devices ranging from medical devices to cell phones to servers, improving the uniformity of the emissions profile in each of those applications.

In accordance with at least one embodiment of the present disclosure, the shield 104 can be caused to undulate by an application of force from a source other than the movement of air within the housing. For example, the shield 104 can be caused to undulate by the application of a mechanical force generated by an electromechanical component, such as an actuator.

Additional advantages of the shield 104 include the utilization of conductive ink printed on the surface of the polycarbonate sheet of the shield 104. The conductive ink reduces ESD susceptibility of the ITE system 108 during maintenance. In particular, the conductive ink acts as a low impedance path across a wide frequency range. As a result, the conductive ink redirects discharge current from human touch or an ESD simulator tool into the shield 104 and away from sensitive electronics.

Intentional patterning of the conductive ink on the surface of the shield 104 can be utilized to target specific frequency ranges for optimal energy transfer. More specifically, in accordance with at least one embodiment of the present disclosure, the shield is bonded to the housing around the perimeter of the shield. This bonding enables an intentional patterning of conductive ink to absorb susceptible radiated emissions frequencies being emitted from components such as printed circuit board traces and/or system oscillators and clocks. Reducing these emissions within the system can lower the radiated emissions content being emitted from product openings. Efficiency can be optimized to the targeted frequency range with tools such as in-silico simulation or lab experimentation. Any known frequency susceptibilities can be targeted for energy absorption, lowering the total radiated power emitted from the ITE system 108.

Additionally, any audible noise emitted by the vibration of the active shield 104 can be tuned to a frequency, amplitude, and phase angle that either cancels or compensates for the fan and/or blower noise, thereby dampening it. For example, the speed of the fan and/or blower can be adjusted to change the waveform, and therefore the frequency, amplitude, and/or phase angle, exhibited by the shield 104. Alternatively, electrical or thermal energy can be applied to the shield 104 through the conductive ink to cause the shield 104 to vibrate out of phase with the fan and/or blower's noise emissions.

Additionally, adjusting the vibration profile of the conductive sheet (for example, by adjusting the fan and/or blower speed) can be used as a tuning mechanism to achieve optimal isotropic electromagnetic energy radiation properties. This could also be accomplished by using activatable polymers, such as, for example, thermo-reactive polymers, thermo-responsive polymers, electroactive polymers, and/or stimuli-responsive polymers. In other words, embodiments of the present disclosure enable the shield 104 to be made active by the application of thermal, electrical, and/or mechanical energy applied to the shield 104 as a result of various control signals.

Notably, utilization of the EMC device 100 also allows for design and/or fabrication tolerances to be relaxed, because the distribution of EMI emissions achieved by the active shield 104 can compensate for increased EMI leakage caused, for example, by deficiencies or defects at gaps, seams, or other openings in the housing of the ITE system.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. An information technology system, comprising:
a housing;
electronics arranged within the housing;
a flexible shield arranged within the housing such that when the electronics emit electromagnetic interference at least some of the electromagnetic interference is incident upon a surface of the flexible shield, the flexible shield configured to be alternately at rest and active, wherein the surface of the flexible shield is substantially planar when the flexible shield is at rest and the surface of the flexible shield is undulating when the flexible shield is active.

2. The information technology system of claim 1, wherein the surface is substantially parallel to a wall of the housing when the flexible shield is at rest.

3. The information technology system of claim 2, wherein the flexible shield is arranged between the electronics and the wall of the housing.

4. The information technology system of claim 1, further comprising:
a fan arranged within the housing and configured to move air within the housing such that the moving air causes the flexible shield to be active.

5. The information technology system of claim 4, wherein the flexible shield is configured such that a rate of undulation of the flexible shield is affected by a rate at which the fan moves the air.

6. The information technology system of claim 4, wherein:
the fan is configured to expel air in a direction along a line that exists in a plane;
the flexible shield is arranged such that when the flexible shield is at rest, the surface defines a further plane; and
the further plane is parallel to the plane.

7. The information technology system of claim 6, wherein the further plane is coincident with the plane.

8. The information technology system of claim 1, wherein the surface of the flexible shield exhibits a waveform when the flexible shield is active.

9. The information technology system of claim 1, wherein the surface of the flexible shield is configured to reflect the electromagnetic interference that is incident thereupon.

10. The information technology system of claim 1, wherein the flexible shield includes a polycarbonate sheet.

11. The information technology system of claim 10, wherein the flexible shield includes a pattern of conductive ink formed on the polycarbonate sheet.

12. The information technology system of claim 11, wherein the flexible shield is configured such that a rate of undulation of the flexible shield is affected by applying electricity to the conductive ink.

13. An electromagnetic compatibility device configured for use with an information technology system, the information technology system including a housing and electronics arranged in the housing that emit electromagnetic interference, the electromagnetic compatibility device comprising:
a flexible shield configured to be arranged within the housing such that at least some of the electromagnetic interference is reflected by a surface of the flexible shield, the flexible shield configured to be alternately at rest and active, wherein the surface of the flexible shield is substantially planar when the flexible shield is at rest and the surface of the flexible shield is undulating when the flexible shield is active.

14. The electromagnetic compatibility device of claim 13, wherein the flexible shield includes a polycarbonate sheet.

15. The electromagnetic compatibility device of claim 14, wherein the flexible shield includes a pattern of conductive ink formed on the polycarbonate sheet.

16. The electromagnetic compatibility device of claim 15, wherein the flexible shield is configured such that a rate of undulation of the flexible shield is affected by selectively applying electricity to the conductive ink.

17. A method of operating an information technology system, the method comprising:
causing a surface of a flexible shield to exhibit a waveform including a plurality of angled surface portions such that electromagnetic interference emitted by electronics of the information technology system is reflected off of the plurality of angled surface portions, wherein an angle of each of the plurality of angled surface portions varies over time.

18. The method of claim 17, wherein causing the surface of the flexible shield to exhibit the waveform includes applying electricity to a pattern of conductive ink formed on the surface.

19. The method of claim 17, wherein causing the surface of the flexible shield to exhibit the waveform includes moving air over the surface.

20. The method of claim 19, wherein a frequency of the waveform is determined by a rate at which the air is moved over the surface.

* * * * *